United States Patent [19]
Pomeroy et al.

[11] Patent Number: 5,839,189
[45] Date of Patent: Nov. 24, 1998

[54] BRACKET FOR ATTACHING PIN-IN-HOLE COMPONENTS TO A SURFACE MOUNT BOARD

[75] Inventors: Michael R. Pomeroy, Prescott; Eugene E. Segerson, Gilbert, both of Ariz.

[73] Assignee: Emerson Electric Co., St. Louis, Mo.

[21] Appl. No.: 415,714

[22] Filed: Apr. 3, 1995

[51] Int. Cl.⁶ .................................................. H07R 9/09
[52] U.S. Cl. ........................... 29/839; 29/837; 174/262; 228/179.1
[58] Field of Search ............................. 29/839, 840, 837; 228/179.1; 174/262

[56] References Cited

U.S. PATENT DOCUMENTS

| | | |
|---|---|---|
| 3,833,838 | 9/1974 | Christionen ........................... 29/839 X |
| 4,424,626 | 1/1984 | Pennington ................................ 29/839 |
| 4,679,723 | 7/1987 | Veit et al. ......................... 228/179.1 X |
| 5,051,870 | 9/1991 | Companion ............................ 29/837 X |

FOREIGN PATENT DOCUMENTS

| | | |
|---|---|---|
| 4-147579 | 5/1992 | Japan . |
| 4-219990 | 8/1992 | Japan ........................................ 29/893 |
| 5-259688 | 10/1993 | Japan ...................................... 174/216 |
| 1548816 | 7/1979 | United Kingdom . |

*Primary Examiner*—Carl J. Arbes
*Attorney, Agent, or Firm*—Arnold, White & Durkee

[57] ABSTRACT

A bracket assembly and method for attaching pin-in-hole components and daughter boards to a surface mount printed circuit board which alleviates the problem of the limited peel strength of the interconnect patterns on the surface of surface mount boards and also prevents these components from being subjected to the heat of soldering techniques such as reflow soldering.

19 Claims, 7 Drawing Sheets

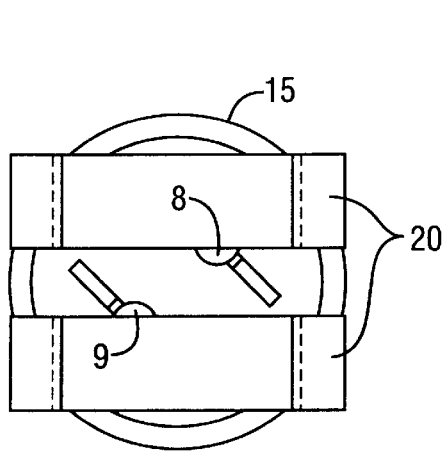
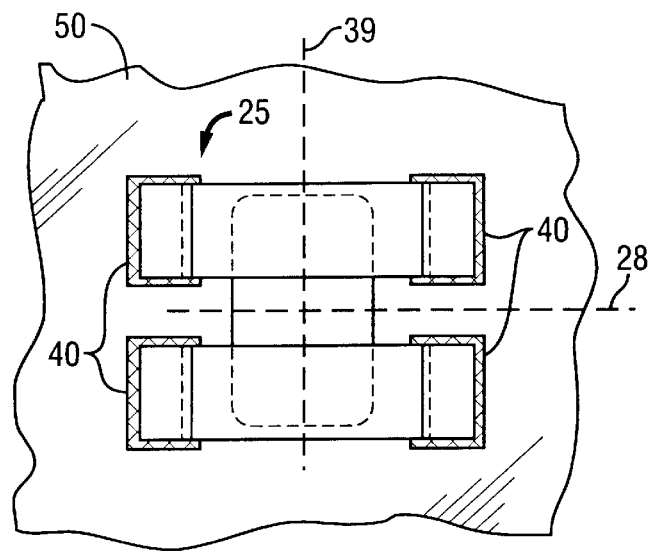
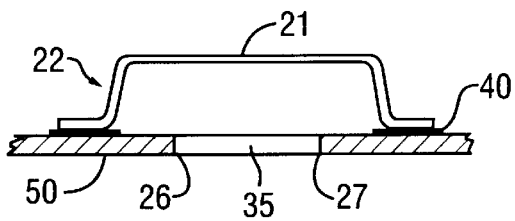
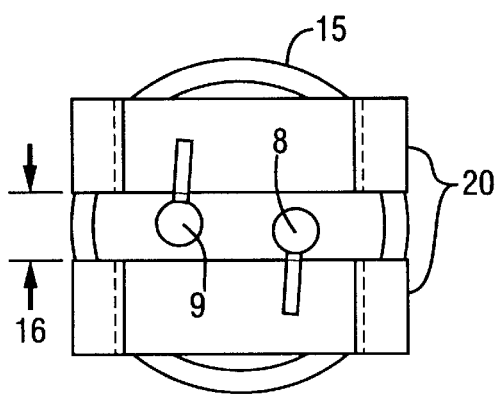
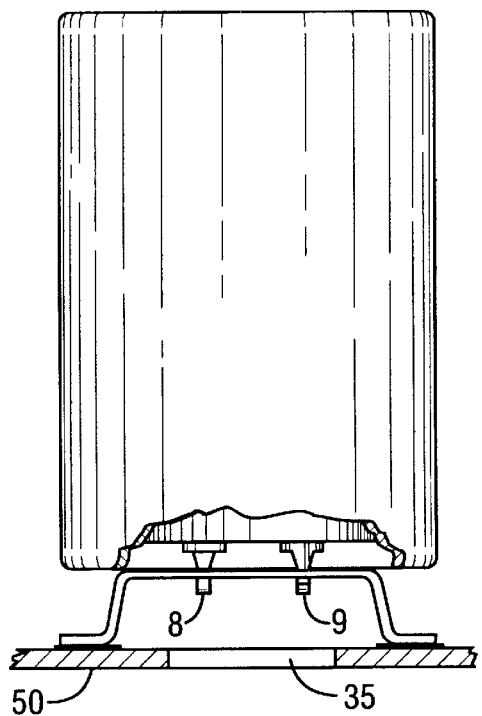
FIG. 8
FIG. 6
FIG. 7
FIG. 9
FIG. 10

BRACKET FOR ATTACHING PIN-IN-HOLE COMPONENTS TO A SURFACE MOUNT BOARD

FIELD OF THE INVENTION

The present invention relates to an apparatus and a method for attaching plated through-hole mounted components to a circuit board for surface mount components. More particularly, the present invention relates to a method for attaching physically large components that would stand a substantial distance above the board (such as a large DC link capacitor) to an insulated metal substrate (IMS) printed circuit (PC) board. Attachment is accomplished using a bracket which provides better vibrational stability and avoids subjecting the capacitor to the high temperatures of vapor phase or continuous belt furnace reflow soldering.

BACKGROUND OF THE INVENTION

Pin-in-hole (PIH) technology uses components with leads that are inserted into the plated through-holes (PTHs) of the board. They are typically soldered into place to establish electrical interconnection using soldering techniques such as wave soldering. Wave soldering is performed by passing the bottom of the PTH board with its many components already in place across the crest of a standing solder wave.

Surface mount technology (SMT) uses components with leads that are soldered to lands on the surface of the board eliminating the need for large diameter PTH sites in the board for accepting component leads. One of the main advantages of SMT over PIH is higher circuit densities. Another advantage of SMT is enhanced electrical performance due to lower impedance of the assembly, reduced noise, and improved frequency response.

The assembly of SMT components ("SMC") to the board typically consists of the following steps: applying a solder paste on the land pattern of the board, placing the leads of the SMCs on the lands, reflowing the solder paste in a soldering phase system, and removing any flux residues.

The soldering systems used most frequently for SMCs are known as vapor phase or continuous belt furnace reflow soldering (reflow soldering). Vapor phase reflow soldering utilizes the latent heat of vaporization stored in a saturated vapor of inert fluorinated organic compounds. Since the temperature in a vapor phase system is controlled by the boiling point of the primary fluid, and heating of the board is very rapid, time in the vapor becomes the only controlling parameter for the system. Time in the vapor zone, which is considerably longer than time on a solder wave, has been found to sometimes have detrimental effects on some SMCs such as capacitors. Similarly, continuous belt reflow soldering has also been found to have detrimental effects on some SMCs such as capacitors.

One disadvantage to using SMT occurs when the electrical circuit requirements dictate that a component with leads adapted for PIH technology and not SMT be used. This problem arises with physically large components and is due to the limited peel strength of the lands on the SMT board. The leads of PIH components simply are not configured to maximize the surface area to be soldered to the lands of a SMT PC board. Specifically, this problem is due to component size, particularly for a component extending vertically above the board, and the limited surface area of the leads to be soldered to the lands of the SMT PC board. Thus, a component above a certain size could not withstand occasional physical contact during assembly operations or vibrational forces that the PC board is subjected to during normal operation because of the limited peel strength of the lands of the SMT PC board.

One example of such a situation exists for the DC Link Capacitor required for use with electronically commutated DC motors. It is advantageous to use SMT for these electronically commutated motors because of the amount of electronic control circuitry required. An insulated metal substrate (IMS) printed circuit (PC) board is used for its heat sink capabilities because the components of the motor control circuitry may dissipate up to 50–60 watts of power. The IMS PC board includes an aluminum heat sink of about one-sixteenth of an inch thick which is coated with a thin polymer coating that is filled with a non-electrically but thermally conductive material such as, for example, $Al_2O_3$ and has a copper foil which when etched provides for the electronic circuitry areas for attaching the many SMCs. It is readily apparent that physically large PIH components cannot be attached to this IMS board via through-holes since the aluminum heat sink would short out the electrical components. The industry standard DC Link capacitor, however, has leads adapted for use with PIH technology and not SMT. While the manufacturers of these components could possibly adapt the leads for SMT boards, it would not provide the most cost effective or reliable solution to this problem. Thus, there is a need for a more cost effective apparatus and method for attaching PIH components such as a DC Link Capacitor to a board adapted for SMCs such as an IMS PC board.

In some unforeseen circumstances additional circuitry in the form of additional electrical components may need to be added to the IMS PC board. Due to the limited space on the IMS PC board, this in turn necessitates attaching a smaller PC board known as a daughter board to the IMS PC board which is now referred to as the mother board. The daughter board will typically have a plurality of electrical components attached to its surface and may be a PTH or SMT PC board. Typically, these daughter boards are attached to the mother board using posts for mechanical attachment to the mother board and wires for electrically connecting the components on the daughter board to the components on the mother board. Another conventional method entails the use of a commercial connector which provides an adequate mechanical and electrical connection between the daughter board and the IMS PC board. These two methods, however, are not the most cost effective solution to the problem. Thus, there is a need for a more cost effective apparatus and method for attaching a daughter board to a mother board.

SUMMARY OF THE INVENTION

The present invention relates to an apparatus and a method for facilitating the connection of electrical components with leads adapted for connection to a PTH board to be used with a SMT PC board.

In accordance with one aspect of the present invention, a bracket having electrically separate terminals with through-holes is attached to an SMT board. The electrical component is attached to the bracket by soldering the leads to their respective terminals. The increased connection area of the bracket to the surface of the SMT PC board alleviates the problem of the limited peel strength of the SMT board.

In accordance with another aspect of the present invention, the leads of an electrical component are configured so that the leads frictionally engage their respective terminals on the bracket when the electrical component is rotated into its operative position, using for example an attachment arrangement analogous to a bayonet mounting.

This enables the leads to be interferingly attached to their respective terminals. Accordingly, the interfering type connection provides a mechanical clamping of the electrical component to the bracket which facilitates soldering the electrical component to the bracket. The increased connection area of the bracket also alleviates the problem of the limited peel strength of the SMT PC boards.

In accordance with another aspect of the present invention a notch is added to each terminal of the bracket and the leads of the electrical component are configured so that the leads which are adjacent to the notches frictionally engage their respective terminals. Accordingly, the leads provide an improved clamp to the bracket that improves the solder joint and facilitates the soldering of the leads. Also, the mechanical strength of the connection between the component and the bracket is enhanced. Once again, the increased connection area alleviates the problem of limited peel strength of the SMT PC boards.

One method for implementing the above embodiments involves attaching and soldering the electrical component to the bracket and then soldering the bracket to the SMT board. A second and preferred method for implementing them involves the use of a solder port for providing access to the attached terminals of the bracket from the underside of the board when the bracket is attached to the SMT PC board prior to attaching the electrical component. Here, the electrical component is attached to the bracket and hand soldered through the solder port. This implementation enables the use of reflow soldering even where the particular component is temperature sensitive. Thus, when either a soldering method (unlike reflow soldering) where temperature may be controlled is used or where the particular electrical component is not temperature sensitive, a solder port is typically not necessary since the electrical component may be attached and soldered prior to soldering the bracket to the SMT board. Of course, in that case a locating fixture is normally required for aligning the component and bracket for soldering.

In accordance with another aspect of the invention, an integrally formed bracket having at least one shorting bar is soldered to an SMT PC board in operative relation to a solder port. The bracket is trimmed by removing the shorting bars to form electrically separate terminals before attaching an electrical component to the bracket. The integrally formed bracket facilitates attachment of the bracket to the SMT board. Also, the increased connection area alleviates the limited peel strength problem of SMT PC boards.

In accordance with still another aspect of the invention, more than one electrical component may be attached to the brackets in any of the above embodiments. In the embodiments which have through-holes or notches, the terminals need one through-hole or notch for each component in the terminals of the bracket to attach each of the electrical components to the bracket. Accordingly, the increased connection area alleviates the limited peel strength of SMT PC boards.

In accordance with another aspect of the invention a daughter board having a plurality of electrical components thereon and a plurality of input/output leads soldered to the edge of the board and bent to form a channel between the leads and the edge of the daughter board may be attached to the SMT board using a bracket according to the principles of the present invention.

BRIEF DESCRIPTION OF THE DRAWINGS

Other aspects and advantages of the eight embodiments described for the present invention may become apparent upon reading the following detailed description and upon reference to the drawings in which:

FIG. 6 shows a top view of a bracket soldered to an IMS PC board according to the third and fourth embodiments of the present invention;

FIG. 7 shows a side view of one of the terminals of the bracket of FIG. 6 on the IMS PC board according to the third and fourth embodiments of the present invention;

FIG. 8 shows a view from underneath the terminals of the bracket of FIG. 6 with the DC link capacitor in its mounting position before being rotated into its operative position according to the third and fourth embodiments of the present invention;

FIG. 9 shows a view from underneath the terminals of the bracket of FIG. 6 with the DC Link capacitor attached to the terminals of the bracket after the capacitor has been rotated into its operative position according to the third and fourth embodiments of the present invention;

FIG. 10 shows a side view of the DC Link Capacitor attached to the bracket of FIG. 6 which is attached to the IMS PC board according to the third and fourth embodiments of the present invention;

DETAILED DESCRIPTION OF THE INVENTION

Figure 1A:
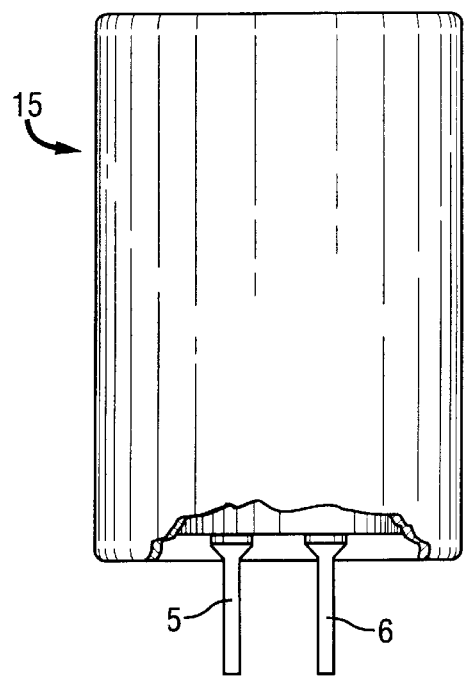
FIG. 1A shows a DC Link Capacitor with PIH leads for attachment to a PTH board.

Illustrative embodiments of the invention are described below as they may be implemented by using a bracket to attach PIH components to a Surface Mount Technology (SMT) printed circuit (PC) board to help overcome the limited peel strength of the lands on a SMT PC board and also to avoid subjecting the particular component to the high temperatures of reflow soldering. In the interest of clarity, not all features of an actual implementation are described in this specification. It will of course be appreciated that in the development of any such actual implementation (as in any development project), numerous implementation-specific decisions may be required to achieve the developer's specific goals; such goals may include as compliance with system-related and business-related constraints, which can vary from one implementation to another. Moreover, it will be appreciated that such a development effort might be complex and time-consuming, but would nevertheless be a routine undertaking for those of ordinary skill in the art having the benefit of this disclosure.

The present invention in a preferred embodiment uses a bracket for attaching PIH components to a SMT PC board adapted for attaching SMCs. The terminals of the bracket act to provide a large area of contact with the lands on the SMT PC board. Vibrational forces to which the SMT PC board is typically subjected are thereby distributed over a large contact area between the terminals of the bracket and the lands of the SMT PC board. This enables physically larger components to be attached than the limited peel strength of the board would normally allow. On SMT PC boards such as an IMS board, PIH components simply cannot be attached to the board via holes because of the aluminum heat sink which would short out the components.

When the bracket is operatively aligned with a solder port it may be reflow soldered to the SMT board with the other SMCs allowing the electrical components to be attached and soldered (usually by hand) to the bracket afterwards. This helps prevent subjecting the electrical component to the high temperatures of reflow soldering. This is important where the particular component is adversely affected by the high temperatures of reflow soldering (technique most frequently used for SMT). Otherwise a non-standard soldering technique having the ability to control and monitor temperature such as a hot plate soldering technique during soldering may need to be used. Of course, if subjecting the particular PIH component to such temperatures is not a problem or if a soldering method where the temperature can be controlled is already being used, the electrical components may be attached and soldered to the bracket before it is soldered to the SMT board; thereby, eliminating any need for a solder port which provides access underneath the bracket for soldering the leads of the PIH component to the bracket terminals. In that case as is known by those skilled in the art, a locating fixture is used to align the capacitor and the bracket for soldering.

Figure 1B:
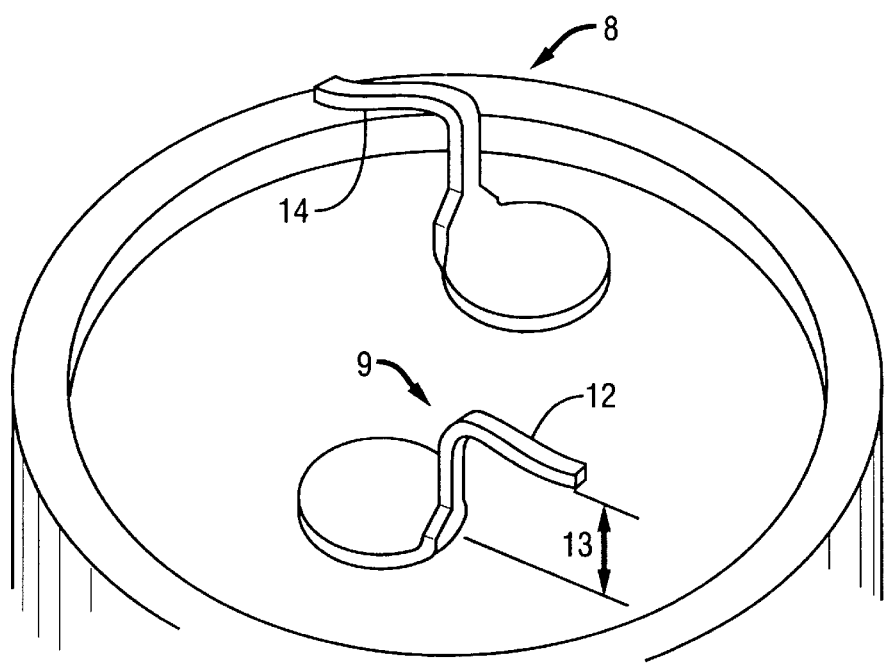
FIG. 1B shows the leads of FIG. 1A formed according to one principles of the present invention.
Figure 2:
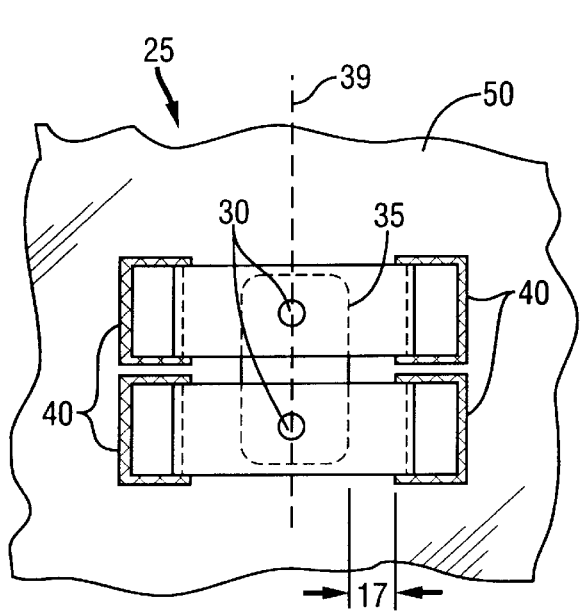
FIG. 2 shows a top view of a bracket with through-holes soldered to an IMS PC board according to the first two embodiments of the present invention.
Figure 4:
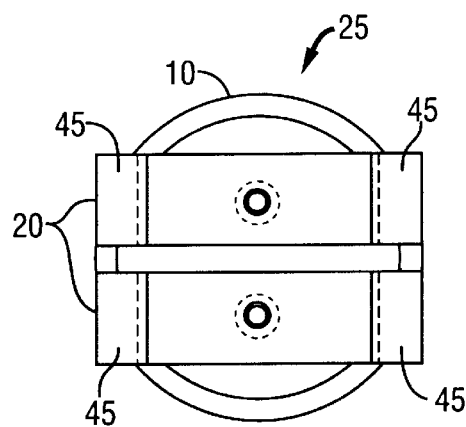
FIG. 4 shows a view from underneath the terminals of the bracket with the DC Link Capacitor attached to the terminals of the bracket according to the first two embodiments of the present invention.
Figure 3:
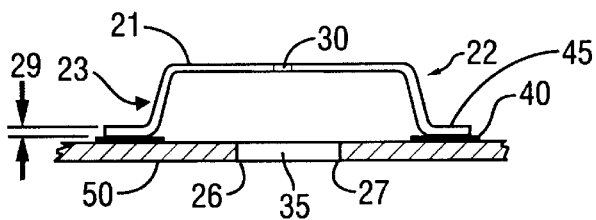
FIG. 3 shows a side view of one of the terminals of the bracket of FIG. 2 on the IMS PC board according to the first two embodiments of the present invention.
Figure 5:
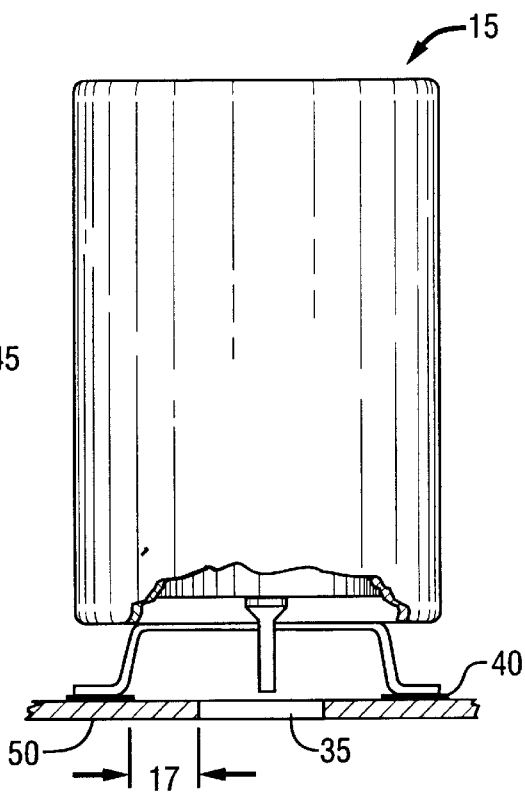
FIG. 5 shows a side view of the DC Link capacitor attached to the bracket of FIG. 2 which is attached to the IMS PC board according to the first two embodiments of the present invention.
Figure 12:
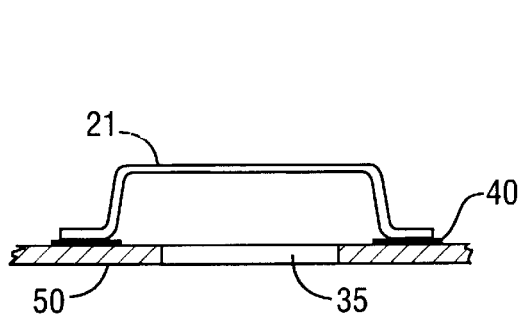
FIG. 12 shows a side view of one of the terminals of the bracket of FIG. 11 on the IMS PC board according to the fifth and sixth embodiments of the present invention.
Figure 11:
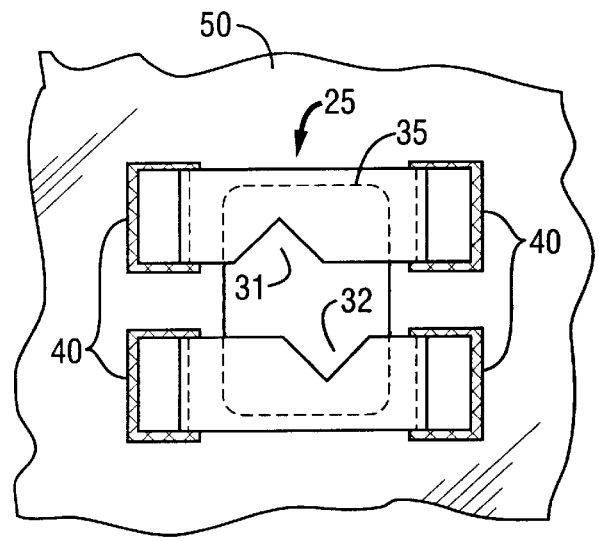
FIG. 11 shows a top view of a bracket with notches soldered to an IMS PC board according to the fifth and sixth embodiments of the present invention.
Figure 13:
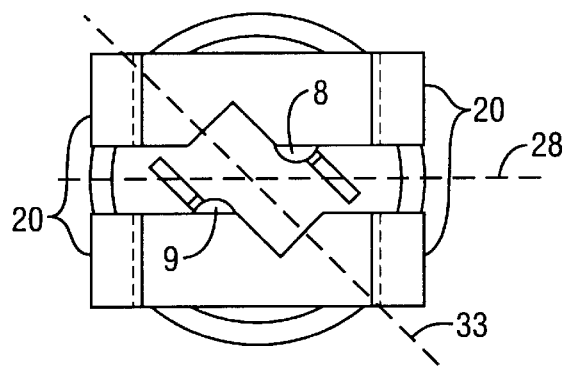
FIG. 13 shows a view from underneath the terminals of the bracket of FIG. 11 with the DC Link Capacitor in its mounting position before being rotated into its operative position according to the fifth and sixth embodiments of the present invention.
Figure 14:
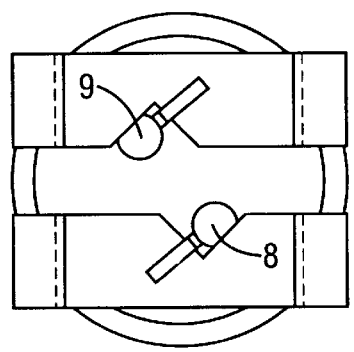
FIG. 14 shows a view from underneath the terminals of the bracket of FIG. 11 with the DC Link Capacitor attached to the terminals of the bracket after the capacitor has been rotated into its operative position according to the fifth and sixth embodiments of the present invention.
Figure 15:
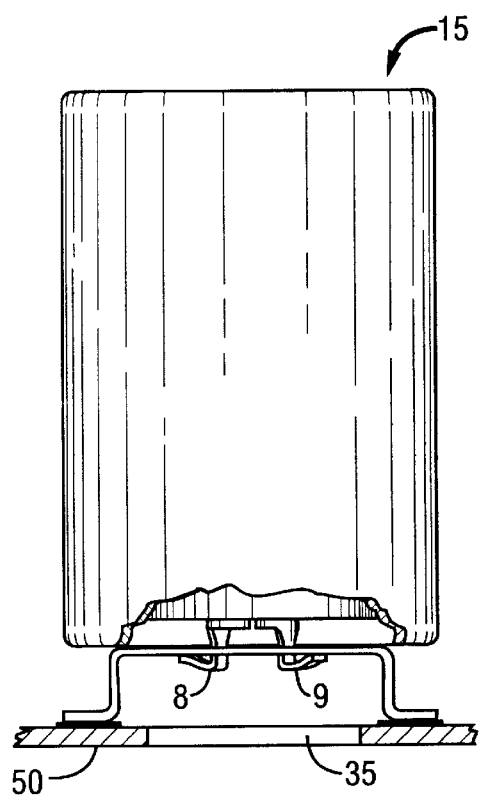
FIG. 15 shows a side view of the DC Link Capacitor attached to the bracket of FIG. 11 which is attached to the IMS PC board according to the fifth and sixth embodiments of the present invention.

FIG. 1A shows the two leads 5 and 6 of an industry standard PIH DC Link capacitor 15 for attachment to a PTH board. Several embodiments described herein are directed to brackets for attaching this DC Link capacitor to an IMS surface mount board, with leads as shown in FIG. 1B. Other embodiments employ leads as depicted in FIG. 1A. An other embodiment is directed to a bracket for attaching a daughter board to an IMS SMT PC board. The description of these specific embodiments should not be interpreted in any way to limit the scope of the present invention. The principles of the present invention are applicable to attaching one or more physically large components and daughter boards to a SMT board.

Referring to FIGS. 2–5 a first embodiment of a bracket assembly and method for mounting a physically large pin-in-hole (PIH) component to a surface mount technology (SMT) printed circuit (PC) board is described. The bracket assembly includes a bracket 25, an insulated metal substrate (IMS) SMT PC board 50 such as, for example a Denka Hitt Plate manufactured by Denka Corporation, New York, N.Y., and a DC Link Capacitor 15.

The bracket 25 includes two electrically separate conductive terminals 20. The terminals 20 are preferably identical in size and shape. Each of the terminals 20 includes an upper surface 21, two vertically oriented members 22, and two contact members 45. The terminals 20 may be made of any conductive metal such as, for example, copper, brass, or steel. Aluminum may also be used but aluminum needs to be plated before it can be soldered to the IMS PC board. Preferably, the terminals 20 may be made of copper. The thickness 29 of the terminals 20 should be sufficient to provide the structural integrity needed for the bracket to support the weight of the capacitor 15. The thickness 29 may be determined using well known methods. The terminals 20 of the bracket 25 may be made using well known methods. Preferably, the terminals 20 may be formed using two identical rectangularly shaped metal strips and placing, two identical but opposing Z shaped bends 23 in each to form the terminals 20.

The bends 23 are placed so that the upper surfaces 21 of terminals 20 will be at least long enough so that the outer shell 10 of the capacitor 15 rests on the upper surfaces 21 when the capacitor 15 is in its operative position on the bracket 25. The upper surfaces 21 include through-holes 30 appropriately sized so that when the leads 5 and 6 are placed in the through-holes 30 the outer shell 10 of the capacitor 15 rests on the upper surfaces 21 of the terminals 20. The through-holes 30 may be formed using well known methods. Preferably, the through-holes 30 may be formed during the shaping of the bracket 25 in a stamping operation using a punch and die set in a stamping press. The through-holes 30 are preferably centered in their respective terminals 20, and in that case the spacing between the terminals 20 is fixed by the distance between the leads 5 and 6 of the capacitor 15.

The bends 23 form an angle between each of the vertically oriented members 22 and the surface of the IMS SMT PC board 50 which preferably is in the range of about 68 degrees to 88 degrees. The vertically oriented members 22 should be sized so that when the bracket 25 is attached to the IMS PC board 50, the height above the IMS PC board 50 of the upper surfaces 21 provides sufficient clearance for the leads 5 and 6 when the capacitor 15 is in its operative position on the bracket 25.

The area of each of the two contact members 45 for each of the terminals 20 may be determined using well known methods to provide a contact area which is large enough to alleviate the limited peel strength of the lands 40 on the IMS PC board 50. The methods typically account for factors which include the weight and height of the capacitor 15, the operational and manufacturing forces that the capacitor 15 may be subjected to, and the peel strength of the IMS PC board 50.

The IMS PC board 50 includes the lands 40 which are a few of the many lands which make up a predetermined conductive interconnect pattern (not shown) on the surface of the IMS PC board 50. The interconnect pattern provides the electrical connection of the surface mount components (SMCs) on the board 50. The interconnect pattern which includes the lands 40 may be made of electrically conductive materials using well known methods. Preferably, the interconnect pattern including the lands 40 is formed by etching the copper foil (0.001 inches to 0.003 inches thick) which adheres to the thermally conductive but electrically isolated polymer interface between the copper foil and the metal substrate. The metal substrate may be, for example, 1/16th of an inch thick aluminum. The lands 40 may be sized so that they overlap the contact members 45 when the bracket 25 is operatively positioned on the IMS PC board 50. Preferably, the lands 40 completely overlap all the edges of the contact members 45 sufficiently to provide for solder menisus at the interface of the edge of the contact members 45 and the lands 40.

The method for assembling the bracket assembly of this first embodiment includes the steps of: placing the capacitor 15 in operative position on the bracket 25, electrically connecting the leads 5 and 6 to the respective terminal 20 of the bracket 25, and soldering the bracket 25 to the IMS PC board. The capacitor 15 may be placed in operative position on the bracket 25 using well known method, Preferably, the capacitor 15 is placed in operative position on the bracket 25 by using a locating fixture for aligning the bracket 25 and the capacitor 15 so that the leads 5 and 6 of capacitor 15 can be placed in the through-holes 30 of their respective terminals 20. The leads 5 and 6 may be electrically connected to the bracket 25 using well known methods. Preferably, the leads 5 and 6 of the capacitor 15 may be hand soldered to the terminals 20 of the bracket 25 using the locating fixture for aligning the bracket 25 and the capacitor 15. The bracket 25 may be soldered to the IMS PC board using well known methods. Preferably, the terminals 20 of the bracket 25 are soldered to the lands 40 of the IMS PC board along with the other SMCs using a hot plate soldering method if the capacitor 15 is temperature sensitive. Otherwise, vapor phase reflow soldering (reflow soldering) is the preferred soldering method.

Referring again to FIGS. 2–5 a second embodiment of a bracket assembly and method for mounting a physically large PIH component to a SMT PC board is described. Elements of the second embodiment previously discussed having identical item numbers are identical as to form and function. The bracket assembly includes a bracket 25, an insulated metal substrate (IMS) SMT PC board 50, and a DC Link Capacitor 15.

The IMS PC board 50 in this second embodiment further includes a solder port 35. The solder port 35 provides access underneath the bracket 25 so that the capacitor 15 may be hand soldered to the bracket 25 after it has been soldered to the IMS PC board. The solder port 35 is a hole in the IMS PC board 50 which may be formed using well known methods. Preferably, the solder port 35 may be formed using a stamping die in a punch press. The solder port 35 should be positioned to provide access underneath the bracket 25 so that the leads 5 and 6 of the capacitor 15 may be hand soldered to the respective terminal 20 of the bracket 25. Preferably, the solder port 35 may be positioned along the lateral axis 39 of the bracket 25. Although the solder port should be large enough so that the leads 5 and 6 of the capacitor 15 may be hand soldered to the respective terminal 20 of the bracket 25, the size of the solder port 35 should adhere to the creepage distance 17 which is determined by the maximum operating voltage and the safety standards established by regulatory agencies such as UL and IEC. Preferably, the solder port 35 may be rectangularly shaped with rounded corners. The length of the solder port 35 preferably may be approximately equal to the width of the bracket 25.

The method for assembling the bracket assembly of this second embodiment includes the steps of: providing a solder port 35 operatively aligned with a bracket 25, soldering the bracket 25 to the IMS PC board, placing the capacitor 15 in operative position on the bracket 25, and electrically connecting the capacitor 15 to the bracket 25. The bracket 25 may be soldered to the IMS PC board using well known methods. Preferably, the terminals 20 of the bracket 25 are soldered to the lands 40 of the IMS PC board 50 along with the rest of the SMCs using the reflow soldering technique. Then the capacitor 15 may be placed in operative position on the bracket 25 using well known methods. Preferably, the leads 5 and 6 of the capacitor 15 are placed in the through-holes 30 of their respective terminals 20 of the bracket 25. The capacitor 15 may be electrically connected to the bracket 25 using well known methods. Preferably, the leads 5 and 6 of the capacitor 15 may be hand soldered to the terminals 20 of the bracket 25 using the access provided by the solder port 35 on the IMS PC board 50.

Referring now to FIGS. 6–10 a third embodiment of a bracket assembly and method for mounting a physically large PIH component to a SMT PC board is described. Elements of the third embodiment previously discussed having identical item numbers are identical as to form and function. The bracket assembly includes a bracket 25, an insulated metal substrate (IMS) SMT PC board 50, and a DC Link Capacitor 15.

The capacitor 15 includes leads 8 and 9 which should be formed as shown in FIG. 1B to frictionally engage and interferingly fit on the terminals 20. This provides a mechanical clamping of the capacitor 15 to the bracket 25 which facilitates soldering of the bracket 25 to the capacitor 15 and improves the resulting solder joint of the leads 8 and 9 to their respective terminals 20. Preferably, the leads 8 and 9 are formed with opposing Z shapes with the bottom legs 12 formed with opposing S shapes. Preferably, the crests 14 of the bottom legs 12 form a slot 13 with the outer shell 10 of the capacitor 15 having a width slightly smaller than the thickness of the upper surfaces 21 of the terminals 20. The leads 8 and 9 may be formed using well known methods by either the manufacturer of the capacitor 15 or at the assembly station.

The terminals 20 of the bracket 25 have upper surfaces 21 without the through-holes 30 of the first two embodiments. The vertically oriented members 22 should still be sized so that when the bracket 25 is attached to the IMS PC board 50 the height of the upper surfaces 21 above the IMS PC board 50 provides sufficient clearance for the leads 8 and 9 when the capacitor 15 is attached to the bracket 25. In this third embodiment the height of the upper surfaces 21 above the IMS PC board 50 need not be as high. This is due to the fact that less clearance is required for the formed leads 8 and 9 of the capacitor 15. In this third embodiment the terminals 20 of the bracket 25 should be spaced a distance slightly larger than the distance between the leads 8 and 9 of the capacitor 15.

The method for assembling the bracket assembly of this third embodiment includes the steps of: placing the capacitor 15 in operative position on the bracket 25, electrically connecting the leads 8 and 9 to the bracket 25, and soldering the bracket 25 to the IMS PC board 50. The capacitor 15 may be placed in operative position on the bracket 25 using well known methods. Preferably, the capacitor 15 is placed in operative position on the bracket 25 by using a locating fixture for aligning the bracket 25 and the capacitor 15. First, the leads 8 and 9 of capacitor 15 are placed in their mounting position relative to their respective terminals 20. Then the capacitor 15 is rotated so that the leads 8 and 9 are rotated into operative position to their respective terminals 20. Preferably, the leads 8 and 9 of the capacitor 15 are rotated about 40 degrees to 50 degrees relative to their orientation in the mounting position. The leads 8 and 9 may be electrically connected to the bracket 25 using well known methods. Preferably, the leads 8 and 9 of the capacitor 15 may be hand soldered to the terminals 20 of the bracket 25 using the locating fixture for aligning the bracket 25 and the capacitor 15. The bracket 25 may be soldered to the IMS PC board using well known methods. Preferably, the terminals 20 of the bracket 25 may be soldered to the lands 40 of the IMS PC board along with the other SMCs using a hot plate soldering method if the capacitor 15 is temperature sensitive. Otherwise, vapor phase reflow soldering (reflow soldering) is the preferred soldering method.

Referring again to FIGS. 6–10 a fourth embodiment of a bracket assembly and method for mounting a physically large PIH component to a SMT PC board is described. Elements of the fourth embodiment previously discussed having identical item numbers are identical as to form and function. The bracket assembly includes a bracket 25, an insulated metal substrate (IMS) SMT PC board 50, and a DC Link Capacitor 15.

The IMS PC board 50 in this fourth embodiment further includes a solder port 35. The solder port 35 provides access underneath the bracket 25 so that the capacitor 15 may be hand soldered to the bracket 25 after it has been soldered to the IMS PC board along with the other SMCs. Although the size of the solder port 35 should still be large enough so that the leads 8 and 9 of the capacitor 15 can be hand soldered to the bracket 25, the size of the solder port 35 should adhere to the minimum creepage distance 17. Preferably, the solder port 35 may be shaped with rounded corners. The edges 26 and 27 are each at least the creapage distance 17 from the lands 40. The length should be approximately equal to the width of the bracket 25. In this fourth embodiment, the length of the solder port 35 should be larger because of the increased space between the terminals 20. The width of the solder port 35 should also be larger because of the operative position along the longitudinal axis 28 of the leads 8 and 9 of the capacitor 15.

The method for assembling the bracket assembly of this fourth embodiment includes the steps of: providing a solder port 35 operatively aligned with a bracket 25, soldering the bracket 25 to the IMS PC board, placing the capacitor 15 in operative position on the bracket 25, electrically connecting the capacitor 15 to the bracket 25. The bracket 25 may be soldered to the IMS PC board using well known methods. Preferably, the contact members 45 of the terminals 20 are soldered to the lands 40 of the IMS PC board 50 along with the rest of the SMCs using the reflow soldering technique. The capacitor 15 may be placed in operative position on the bracket 25 using well known methods. Preferably, the leads 8 and 9 of capacitor 15 are first placed in a mounting position relative to their respective terminals 20. Then the capacitor 15 is rotated so that the leads 8 and 9 are rotated into operative position to their respective terminals 20. Preferably, the capacitor 15 is rotated about 40 degrees to 50 degrees relative to the mounting position so that the leads 8 and 9 frictionally engage and interferingly fit on their respective terminals 20. The capacitor 15 may be electrically connected to the bracket 25 using well known methods. Preferably, the leads 8 and 9 of the capacitor 15 may be hand soldered to the terminals 20 of the bracket 25 using the access provided by the solder port 35 on the IMS PC board 50.

Referring now to FIGS. 11–15 a fifth embodiment of a bracket assembly and method for mounting a physically large PIH component to a SMT PC board is described. Elements of the fifth embodiment previously discussed having identical item numbers are identical as to form and function. The bracket assembly includes a bracket 25, an insulated metal substrate (IMS) SMT PC board 50, and a DC Link Capacitor 15.

The capacitor 15 in this embodiment also includes leads 8 and 9 providing the mechanical clamping of the capacitor 15 to the bracket 25 which facilitates the soldering of the capacitor 15 to the bracket 25 and also improving the resulting solder joint of the leads 8 and 9 to their respective terminals 20.

The terminals 20 of the bracket 25 have upper surfaces 21 without the through-holes 30 of the first two embodiments. In this fifth embodiment, the bracket 25 includes notches 31 and 32 on the terminals 20 which further facilitate the soldering of the leads 8 and 9 of the capacitor 15 to the terminals 20 of the bracket 25. The notches 31 and 32 should be a complementary shape such as, for example, triangular, conical, or rectangular and operatively placed for accepting the leads 8 and 9 when the capacitor 15 is rotated into its operative position. Preferably, the notches 8 and 9 may be triangularly shaped. The notches 31 and 32 preferably should be placed so that are centered along the notch axis 33 which is about 135 degrees relative to the longitudinal axis 28 measured counter clockwise. The notches 31 and 32 may be formed using well known metal working methods such as, for example, a punch and die set mounted in a stamping press.

The method for assembling the bracket assembly of this fifth embodiment includes the steps of: placing the capacitor 15 in operative position on the bracket 25, electrically connecting the leads 8 and 9 to the bracket 25, and soldering the bracket 25 to the IMS PC board. The capacitor 15 may be placed in operative position on the bracket 25 using well known methods. Preferably, the capacitor 15 is placed in operative position on the bracket 25 by using a locating fixture for aligning the bracket 25 with the capacitor 15. First, the leads 8 and 9 of capacitor 15 are placed in their mounting position relative to their respective terminals 20. Then the capacitor 15 is rotated so that the leads 8 and 9 are rotated into operative position to their respective terminals 20. Preferably, the capacitor 15 is rotated about 85 degrees to 100 degrees relative to the mounting position so that the leads 8 and 9 frictionally engage and interferingly fit on their respective terminals 20. The leads 8 and 9 may be electrically connected to the bracket 25 using well known methods. Preferably, the leads 8 and 9 of the capacitor 15 may be hand soldered to the terminals 20 of the bracket 25 using a locating fixture for aligning the bracket 25 with the capacitor 15. The bracket 25 may be soldered to the IMS PC board using well known methods. Preferably, the contact members 45 of the terminals 20 may be soldered to the lands 40 of the IMS PC board along with the other SMCs using a hot plate soldering method if the capacitor 15 is temperature sensitive. Otherwise, vapor phase reflow soldering (reflow soldering) is the preferred soldering technique.

Referring again to FIGS. 11–15 a sixth embodiment of a bracket assembly and method for mounting a physically large PIH component to a SMT PC board is described. Elements of the sixth embodiment previously discussed having identical item numbers are identical as to form and function. The bracket assembly includes a bracket 25, IMS SMT PC board 50, and a DC Link Capacitor 15.

The IMS PC board 50 in this sixth embodiment further includes a solder port 35. The solder port 35 provides access underneath the bracket 25 so that the capacitor 15 may be hand soldered to the bracket 25 after it has been soldered to the IMS PC board. The width of the solder port 35 should also be larger than in the second embodiment but may be smaller than in the fourth embodiment because of the operative position along the notch axis 33 of the leads 8 and 9 of the capacitor 15.

The method for assembling the bracket assembly of this sixth embodiment includes the steps of: providing a solder port 35 operatively aligned with a bracket 25 soldering the bracket 25 to the IMS PC board, placing the capacitor 15 in operative position on the bracket 25, and electrically connecting the capacitor 15 to the bracket 25. The bracket 25 may be soldered to the IMS PC board using well known methods. Preferably, contact members 45 of the terminals 20 are soldered to the lands 40 of the IMS PC board 50 along with the rest of the SMCs using the reflow soldering technique. The capacitor 15 may be placed in operative position on the bracket 25 using well known methods. Preferably, the leads 8 and 9 of capacitor 15 are first placed in their mounting position relative to their respective terminals 20. Then the capacitor 15 is rotated so that the leads 8 and 9 are rotated into operative position to their respective terminals 20. Preferably, the capacitor 15 is rotated about 85 degrees to 100 degrees relative to the mounting position so that the leads 8 and 9 frictionally engage and interferingly fit on their respective terminals 20. The capacitor 15 may be electrically connected to the bracket 25 using well known methods. Preferably, the leads 8 and 9 of the capacitor 15 are hand soldered to the terminals 20 of the bracket 25 using the access provided by the solder port 35 on the IMS PC board 50.

Figure 16:
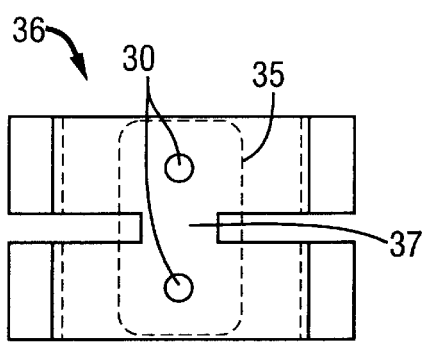
FIG. 16 shows an integrally formed bracket with a shorting bar and through-holes according to the seventh embodiment of the present invention.
Figure 17:
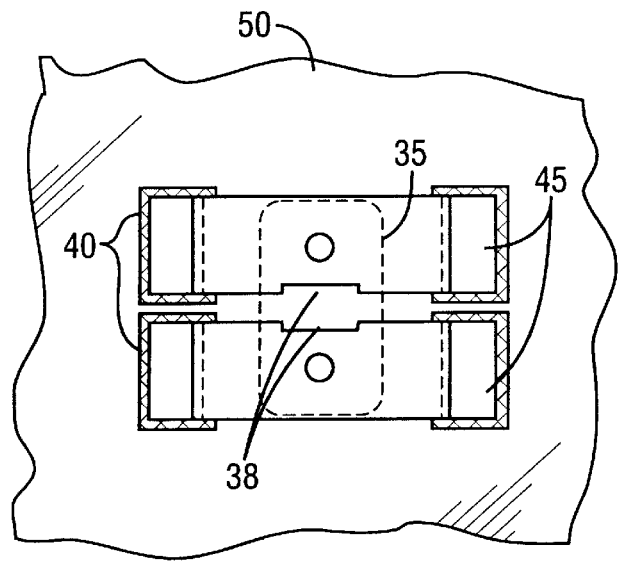
FIG. 17 shows the top view of the bracket of FIG. 16 with respect to the solder port and an IMS PC board after the bracket has been trimmed by removing the shorting slug according to the seventh embodiment of the present invention.
Figure 18:
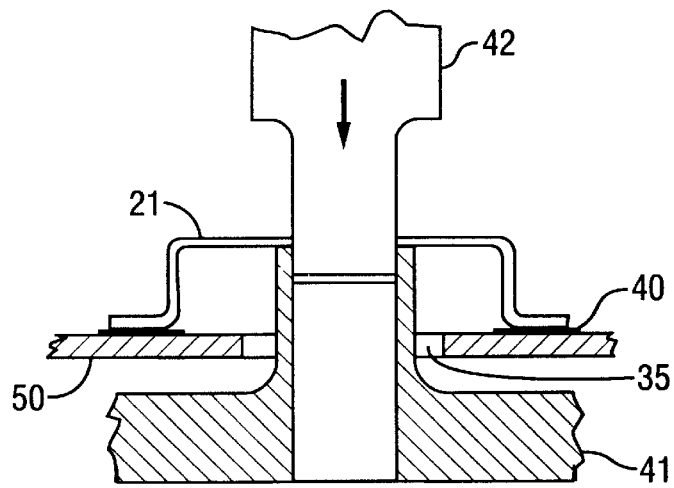
FIG. 18 illustrates the bracket of FIG. 16 being trimmed using a die section and a punch according to the seventh embodiment of the present invention.
Figure 19:
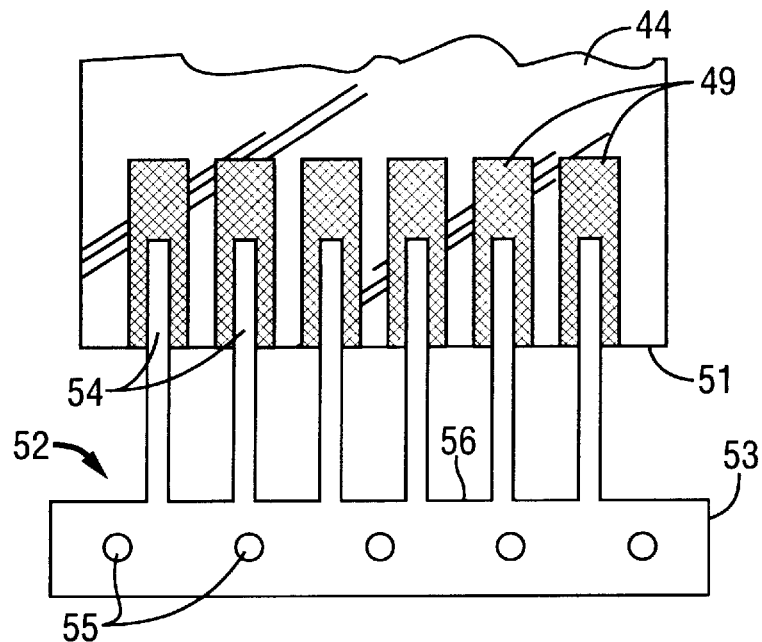
FIG. 19 illustrates the lead fingers of a lead strip being connected to the edge of the daughter board according to the eighth embodiment of the present invention.
Figures 20, 21:
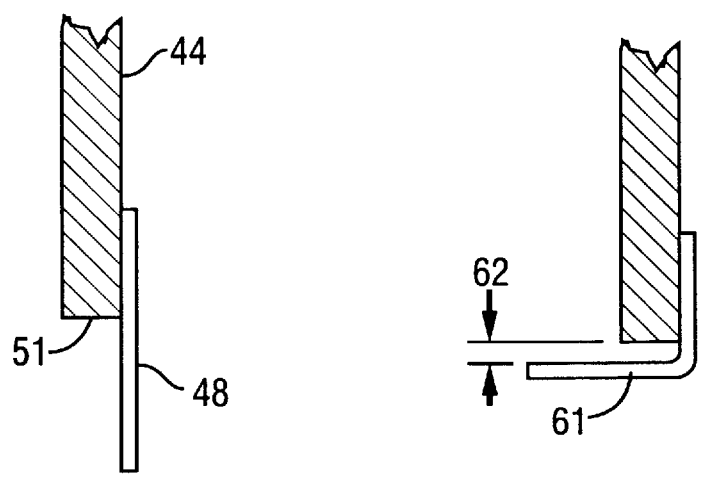
FIG. 20 shows a side view of one of the leads of the daughter board according to the eighth embodiment of the present invention.
FIG. 21 shows a side view of one of the leads of the daughter board after the leads have been formed according to the eighth embodiment of the present invention.
Figure 22:
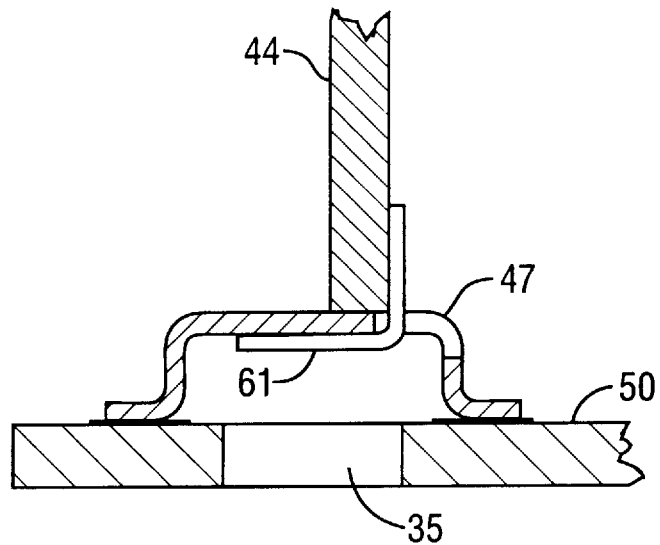
FIG. 22 shows a side view of the daughter board in operative position on a bracket which is soldered to the mother board according to the eighth embodiment of the present invention.
Figure 23:
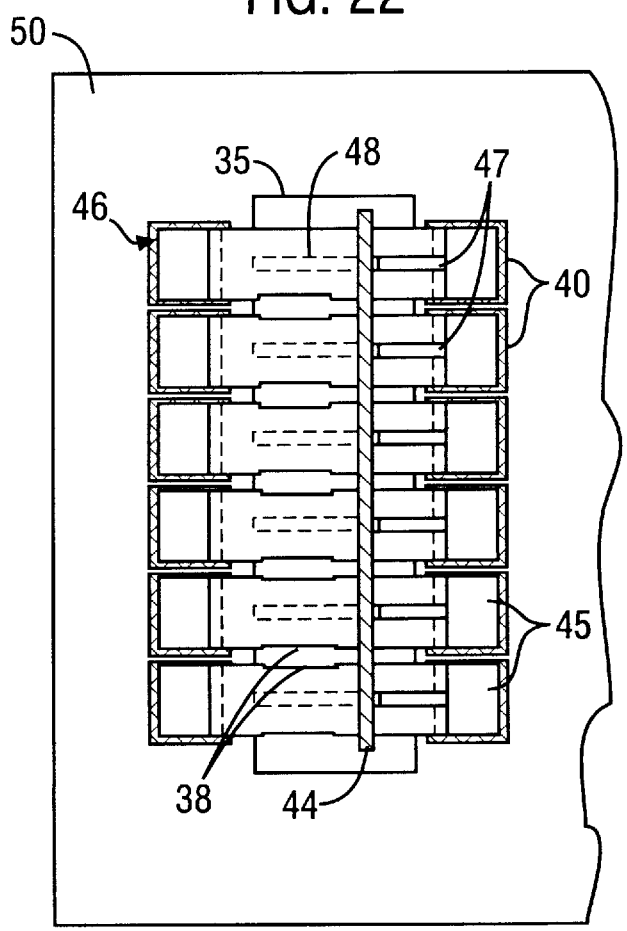
FIG. 23 shows a top view of the daughter board in operative position on the bracket of FIG. 22 which is soldered to the mother board according to the eighth embodiment of the present invention.

Referring now to FIGS. 16–18 a seventh embodiment of a bracket assembly and method for mounting a physically large PIH component to a SMT PC board is described. Elements of the third embodiment previously discussed having identical item numbers are identical as to form and function. The bracket assembly includes a bracket 36, an insulated metal substrate (IMS) SMT PC board 50, and a DC Link Capacitor 15.

The bracket 36 should be integrally formed and further includes a shorting bar 37 which facilitates attachment of the bracket 36 to the IMS PC board 50. The upper surfaces 21 of the terminals 20 may have imperfections 38 after the bracket 36 has been trimmed to form the electrically separate terminals 20. The upper surfaces 21 further include through-holes 30. Thus, the capacitor 15 should have leads 5 and 6 as indicated in FIG. 1A and not the formed leads 8 and 9 as indicated in FIG. 1B.

The IMS PC board 50 in this seventh embodiment further includes a solder port 35. The solder port 35 provides access underneath the bracket 36 so that the capacitor 15 may be hand soldered to the bracket 36 after it has been soldered to the IMS PC board 50. The solder port 35 also provides access for the die section 41 underneath the bracket 36 for trimming the bracket 36. The solder port 35 should be sized such that the length and the width is also sufficiently large for the die section 41 to be placed through the solder port 35 and in contact with the bottom side of the upper surfaces 21 of the bracket 36.

The method for assembling the bracket assembly of this seventh embodiment includes the steps of: providing a solder port 35 operatively aligned with a bracket 36, soldering the bracket 36 to the IMS PC board 50, trimming the bracket 36 to form the terminals 20, placing the capacitor 15 in operative position on the bracket 36, and electrically connecting the capacitor 15 to the bracket 36. The bracket 36 may be soldered to the IMS PC board using well known methods. Preferably, contact members 45 of the terminals 20 are soldered to the lands 40 of the IMS PC board 50 along with the rest of the SMCs using the reflow soldering technique.

The bracket 36 should be trimmed using the die section 41 and the punch 42. The die section 41 and the punch 42 should first be aligned with the shorting bar 37 using locator holes. Second, the shorting bar 37 should be removed to form the shorting slug by applying a downward force to the punch 42. Preferably, the through-holes 30 may be used as the locator holes.

The capacitor 15 may be placed in operative position on the bracket 36 using well known methods. Preferably, the leads 5 and 6 of the capacitor 15 are placed in the through-holes 30 of their respective terminals 20 of the bracket 36. The capacitor 15 may be electrically connected to the bracket 36 using well known methods. Preferably, the leads 5 and 6 of the capacitor 15 are hand soldered to the terminals 20 of the bracket 36 using the access provided by the solder port 35 on the IMS PC board 50.

Referring now to FIGS. 19–23 an eighth embodiment of a bracket assembly and method for mounting a daughter board 44 to a SMT PC board is described. Elements of the eighth embodiment previously discussed having identical item numbers are identical as to form and function. The bracket assembly includes a bracket 46, an IMS PC board (mother board) 50, and a daughter board 44.

The bracket 46 should be integrally formed for facilitating the attachment of the bracket 46 to the IMS PC board 50. The bracket 46 should include a plurality of terminals 20 and a plurality of shorting bars 37 the number of shorting bars 37 being one less than the number of terminals 20 such as, for example, six terminals 20 and five shorting bars 37.

The terminals 20 of the bracket 46 have upper surfaces 21 without the through-holes 30 of the first two embodiments.

The upper surfaces 21 of the terminals 20 may have imperfections 38 after the bracket 46 has been trimmed to form the electrically separate terminals 20. The upper surfaces 21 and the vertically oriented members 22 of the terminals 20 should further include slots 47 for placing the leads 48 of the daughter board 44. The size and shape of the slots 47 should provide sufficient clearance for sliding the leads 48 of the daughter board 44 into operative position. The slots 47 may be formed using well known methods. Preferably, the slots 47 are rectangularly shaped and may be formed using a punch press prior to bending the terminals 20 into shape.

The daughter board 44 includes a plurality of electrical components (not shown) thereon and a plurality of lands 49. The daughter board 44 may be any type of PC board such as, for example, an IMS PC board. The lands 49 of the daughter board 44 should be placed at one edge 51 of the daughter board 44. The lands 49 are a few of the many lands on the daughter board 44 forming a predetermined interconnect pattern (not shown) for electrically connecting the electrical components on the daughter board 44.

The leads 48 of the daughter board 44 provide a signal path to the mother board 50 for the input/output signals of the daughter board 44. The leads 48 may be electrically connected to the edge 51 of the daughter board 44 using well known methods. Preferably, the leads 48 are attached to the daughter board 44 using a lead strip 52. The lead strip 52 includes a sprocket hold tie bar 53 and a plurality of lead fingers 54. The sprocket holes 55 are for accurately soldering the lead fingers 54 to the lands of the daughter board 44. The lead fingers 54 extend outwardly from one side of the sprocket hold tie bar 53 at an angle of about 90 degrees. The lead fingers 54 and the sprocket hold tie bar 53 are in the same plane. The leads 48 are preferably formed in a backward L shape so that the bottom legs 61 of the leads 48 are underneath the edge 51 of the daughter board 44. The channel 62 formed by the edge 51 of the daughter board 44 and the bottom legs 61 of the leads 48 should be substantially equal to the thickness of the upper surfaces 21 of the terminals 20 to provide a snug fit when the leads 44 are slid into the slots 47 of the terminals 20.

The IMS PC board 50 in this eighth embodiment further includes a solder port 35. The solder port 35 provides access underneath the bracket 46 so that the daughter board 44 may be hand soldered to the bracket 46 after it has been soldered to the IMS PC board (mother board) 50. The solder port 35 also provides access for the die section 41 underneath the bracket 46 when the bracket 46 is being trimmed. The solder port 35 should be sized such that the length and the width is also sufficiently large enough for the die section 41 to be placed through the solder port 35 and in contact with the upper surfaces 21 of the bracket 46.

The method for electrically connecting the leads 48 to the edge 51 of the daughter board 44 includes the steps of: electrically connecting the lead fingers 54 of the lead strip 52 to the edge 51 of the daughter board 44, and removing the sprocket hold tie bar 53. The lead fingers 54 may be electrically connected to the daughter board 44 using well known methods such as, for example, hand soldering the lead fingers 54 to the lands 49 at the same time the SMCs are solder reflowed to the daughter board 44. The sprocket hold tie bar 53 may be removed using well known methods. Preferably, the sprocket hold tie bar 53 is trimmed along the trim line 56 by using a punch and die or a shear.

The method for assembling the bracket assembly of this eighth embodiment includes the steps of: providing a solder port 35 operatively aligned with a bracket 46, soldering the bracket 46 to the IMS PC board 50, trimming the bracket 46 to form the terminals 20, placing the daughter board 44 in operative position on the bracket 46, and electrically connecting the daughter board 44 to the bracket 46. The bracket 46 may be soldered to the IMS PC board using well known methods. Preferably, contact members 45 of the terminals 20 are soldered to the lands 40 of the IMS PC board 50 along with the rest of the SMCs using the reflow soldering technique. Preferably, the daughter board 44 is placed in operative position on said bracket 46 by sliding the leads 48 into their respective slots 47.

The term bracket in the context of the invention connotes any suitable structure which projects from a surface mount board to securely support an electrical component above or spaced from the board, and which also provides necessary electrical connections between the electrical component and circuitry on the board. The bracket includes suitable feet or other foundation members for distributing the weight of the bracket and its electrical component or components on the board so as to provide a reliable and permanent mounting on the board. In one preferred form the bracket may comprise a plurality of electrically conductive members juxtaposed to form a single support structure for one or more components, but wherein the individual members are electrically separate from one another so as to provide separate electrical paths from the component or components to circuitry on the board. Thus, the conductive members may be made of copper, aluminum and like conductor metals which may be soldered to the circuitry. Preferably, the circuitry on the board includes conductive lands to which the conductive members of the bracket may be soldered. Such lands are well known in the art. The conductive members of the bracket are effectively terminals to which leads of components and lands of circuit boards may be soldered or otherwise connected.

Those skilled in the art will readily recognize that various changes and modifications to the illustrative embodiments described above may be made without departing from the true spirit and scope of the present invention, which is set forth in the following claims.

What is claimed is:

1. A method for attaching an electrical component having more than one lead to a surface mount circuit board, said board having a conductive interconnect pattern including a plurality of lands for attaching a plurality of electrical components, the method comprising the steps of:

soldering a bracket to a plurality of said lands, said bracket including a separate said terminal for each said lead;

providing a solder port in said board operatively aligned with said bracket, said port providing access for soldering each said lead to said bracket for electrical connection with its respective terminal; and placing said electrical component in operative position on said bracket; and soldering said leads to said bracket through said solder port.

2. The method of claim 1 wherein the step of placing said electrical component in operative position to said bracket further comprises the steps of:

providing through-holes in said terminals; and placing each said lead in a separate said through hole.

3. The method of claim 1 wherein the step of placing said electrical component in operative position on said bracket further comprises the steps of:

configuring each said lead to be interferingly attached to a separate said terminal;

placing said leads in mounting position with their respective said terminals; and placing said electrical component in operative position to said bracket by rotating said electrical component relative to said bracket and said board to fictionally engage said leads with their respective said terminals.

4. The method of 3 wherein the each said lead is configured to define a slot between said lead and said component which is sufficiently smaller than the thickness of a said terminal to be connected to said lead to fictionally engage each said lead with its respective terminal.

5. The method of claim 1 wherein the step of placing said electrical component in operative position on said bracket further comprises the steps of:

providing a separate notch in said bracket for each said terminal;

configuring each said lead to be interferingly attached to a separate said notch;

placing said leads in mounting position with their respective said notches; and placing said electrical component in operative position to said bracket by rotating said electrical component relative to said bracket and said board to fictionally engage said leads with their respective said notches.

6. The method of 5 wherein the each said lead is configured to define a slot between said lead and said component which is sufficiently smaller than the thickness of a said terminal to be connected to said lead to fictionally engage each said lead with its respective terminal.

7. The method of claim 5 wherein said electrical component is rotated about 95° relative to said bracket and said board.

8. A method for attaching an electrical component having more than one lead to a surface mount circuit board, said board having a conductive interconnect pattern including a plurality of lands for attaching a plurality of electrical components, the method comprising the steps of:

placing said electrical component in operative position on a bracket, said bracket including a separate said terminal for each said lead;

soldering said leads to said bracket; and soldering said bracket to a plurality of said lands.

9. The method of claim 8 wherein the step of placing said electrical component in operative position on said bracket further comprises the steps of:

providing through-holes in said terminals; and placing each said lead in a separate said through hole.

10. The method of claim 8 wherein the step of placing said electrical component in operative position on said bracket further comprises the steps of:

providing a separate notch in said bracket for each said terminal;

configuring each said lead to be interferingly attached to a separate said notch;

placing said leads in mounting position with their respective said notches; and placing said electrical component in operative position to said bracket by rotating said electrical component relative to said bracket and said board to frictionally engage said leads with their respective said notches.

11. The method of 10 wherein the each said lead is configured to define a slot between said lead and said component which is sufficiently smaller than the thickness of a said terminal to be connected to said lead to frictionally engage each said lead with its respective terminal.

12. A method for attaching an electrical component having more than one lead to a surface mount circuit board, said board having a conductive interconnect pattern including a plurality of lands for attaching a plurality of electrical components, the method comprising the steps of:

soldering a bracket to a plurality of said lands, said bracket being integrally formed and including at least one shorting bar;

providing a solder port in said board operatively aligned with said bracket, said port providing access for trimming said bracket and for soldering each said lead to said bracket for electrical connection with its respective terminal; and trimming said bracket through said solder port by removing said shorting bars for electrically separating said bracket into a plurality of terminals including a separate said terminal for each said lead;

placing said electrical component in operative position on said bracket; and soldering said leads to said bracket through said solder port.

13. The method of claim 12 wherein the step of placing said electrical component in operative position on said bracket further comprises the steps of:

configuring each said lead to be interferingly attached to a separate said terminal;

placing said leads in operative position with their respective said terminals; and placing said electrical component in operative position to said bracket by rotating said electrical component relative to said bracket and said board to frictionally engage said leads with their respective said terminals.

14. The method of 13 wherein the each said lead is configured to define a slot between said lead and said component which is sufficiently smaller than the thickness of a said terminal to be connected to said lead to frictionally engage each said lead with its respective terminal.

15. A method for attaching at least one electrical component each having more than one lead to a surface mount circuit board, said board having a conductive interconnect pattern including a plurality of lands for attaching a plurality of electrical components, the method comprising the steps of:

soldering a bracket to a plurality of said lands, said bracket including a plurality of electrically separate terminals including a separate said terminal for each said lead for one of said components;

providing a solder port in said board operatively aligned with said bracket, said port providing access for soldering each said lead to said bracket for electrical connection with its respective terminal; and placing each said electrical component in operative position to said bracket; and soldering said leads to said bracket through said solder port.

16. A method for attaching a daughter board having a plurality of electrical components and more than one lead to a surface mount circuit board, said board having a conductive interconnects pattern including a plurality of lands for attaching a plurality of electrical components, the method comprising the steps of:

soldering a bracket to a plurality of said lands, said bracket being integrally formed and including at least one shorting bar;

providing a solder port in said board operatively aligned with said bracket, said port providing access for trimming said bracket and for soldering each said lead to said bracket for electrical connection with its respective terminal; and trimming said bracket through said solder port by removing said shorting bars for electrically separating said bracket into a plurality of terminals including a separate said terminal for each said lead;

placing said daughter board in operative position on said bracket; and soldering said input/output leads to said bracket through said solder port.

17. The method of claim 16 wherein the step of placing said daughter board in operative position on said bracket further comprises the steps of:

providing a slot in each said terminal;

configuring each said lead to form a channel between said lead and an edge of said daughter board; and sliding said leads into their respective said slots.

18. A method for attaching an electrical component to a surface mount board, the board having a conductive interconnect pattern including a plurality of lands for attaching a plurality of electrical components, the method comprising the operations of:

electrically connecting the component to a daughter board having at least one lead;

placing the daughter board in operative position on a bracket by soldering each lead to the bracket;

soldering the bracket to the plurality of lands, such that the bracket supports the daughter board and the component and electrically connects at least a portion of the component to the interconnect pattern.

19. The method of claim 18, wherein the operation of soldering the bracket to the plurality of lands is conducted prior to the operation in which the component is electrically connected to the daughter board and the operation in which the daughter board is placed in an operative position on the bracket; and wherein the bracket is integrally formed and includes at least one shorting bar;

a solder port is provided in the board operatively aligned with the bracket, the port providing access for trimming the bracket and soldering each lead to the bracket;

the shorting bars of the bracket are trimmed through the solder port to electrically separate the bracket into a plurality of terminals including a separate terminal for each lead.

* * * * *